(12) United States Patent
Yang et al.

(10) Patent No.: US 7,872,509 B2
(45) Date of Patent: Jan. 18, 2011

(54) DELAY LOCK LOOP AND PHASE ANGLE GENERATOR

(75) Inventors: Chih-Wei Yang, Hsinchu (TW); Chien-Hsun Lee, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 12/504,089

(22) Filed: Jul. 16, 2009

(65) Prior Publication Data

US 2009/0278581 A1 Nov. 12, 2009

Related U.S. Application Data (62) Division of application No. 11/761,019, filed on Jun. 11, 2007, now Pat. No. 7,579,889.

(30) Foreign Application Priority Data

Aug. 16, 2006 (TW) .............................. 95130177 A (51) Int. Cl.
*H03L 7/06* (2006.01)

(52) U.S. Cl. ..................................................... 327/158
(58) Field of Classification Search .................. 327/158
See application file for complete search history.

(56) References Cited

U.S. PATENT DOCUMENTS

2004/0113667 A1* 6/2004 Jin .............................. 327/158

* cited by examiner

*Primary Examiner*—Lincoln Donovan
*Assistant Examiner*—Daniel Rojas
(74) *Attorney, Agent, or Firm*—Volpe and Koenig, PC (57) ABSTRACT

The provided delay lock loop delaying an input signal includes a quadrature generator, a voltage controller and a delay cell. The input signal is inputted into the quadrature generator and the delay cell. A phase-changing signal from the quadrature generator and a delay signal respectively from the delay cell are inputted into the voltage controller at the same time so that a control voltage inputted into the delay cell to control a delay time of the delay signal is generated. Also, the provided phase angle generator generates an output signal in an arbitrary phase.

5 Claims, 11 Drawing Sheets

DELAY LOCK LOOP AND PHASE ANGLE GENERATOR

CROSS REFERENCE TO RELATED APPLICATIONS

This application is a division of U.S. patent application Ser. No. 11/761,019, filed Jun. 11, 2007, which is incorporated by reference as if fully set forth.

FIELD OF INVENTION

The present invention relates to a delay lock loop (DLL) synchronizing the internal signals of an electrical system and the external signals. More particularly, the present invention relates to a DLL including a voltage controlled delay line (VCDL).

BACKGROUND

Due to the requirements of the various consumer electronics products are dramatically increasing, different kinds of electrical devices having multi-functions and high responding speed are getting more and more popular. One of the core circuits of such a high-speed and delicate electrical system is the DLL. The main function of a DLL is to synchronize the internal signals of an electrical system and the external signals such that the electrical system could be operated stably and normally. The DLL has various configurations. Classified according to the nature of signals, there are two kinds of DLLs: the digital DLLs and the analog DLLs.

The conventional digital DLLs include the register controlled DLL and the counter controlled DLL. However, the digital DLLs have their unavoidable constraints of using the extra digital controlling circuits to control the DLLs. But for such a digital DLL, relatively the chip size is larger, the power consumption is higher and the accuracy of the delay function is lower.

On the contrary, each of the analog DLLs employs an internal VCDL to achieve the purpose of controlling its delay. A loop voltage is employed to control the cascaded delay cells so as to achieve the desired delay value. Compared with the digital DLLs, the main advantage of the analog DLLs is that the relatively higher accuracy of the generated delay such that relatively the analog DLLs are more frequently employed in the applications of systems requiring higher frequency and higher accuracy regarding their delays.

VCDL is one of the various core circuits of the analog DLLs. Classified according to the configurations, there are two kinds of VCDLs: the active VCDLs and the passive VCDLs. The passive VCDLs employ the passive delay cells including the passive elements such as the resistors and the capacitors. On the other hand, the active VCDLs employ the active delay cells which include MOSFETs. The advantage of the passive VCDLs is that the power consumptions of which are relatively lower, and the disadvantage of which is that the chip sizes of which are relatively larger when the systems requires relatively higher delays. And, the features of the resistors and capacitors are easily influenced by the manufacturing process so as to influence the accuracies of the delay cells. The advantage of the active VCDLs is that the accuracies of which are relatively higher, and the disadvantage of which is that the power consumptions of which are relatively larger. However, both of the active and the passive DLLs are facing the same problem that is if the system requires relatively more detailed delays, relatively the analog DLL would require more delay cells, and again the analog DLLs are facing the same dilemma of larger chip sizes and larger power consumptions. Besides, relatively the noise signals are more significant so as to influence the functions of the DLL when there are more electronic elements.

To improve the above-mentioned problems, one of the thorough solutions is to decrease the number of the delay cells. Although mentioned in the prior art regarding to decrease the number of the delay cells via one of the array arrangement method and the interpolator method, extra digital control circuits are required such that errors are easily generated and the accuracies of the delays are decreased.

Keeping the drawbacks of the prior arts in mind, and employing experiments and research full-heartily and persistently, the applicants finally conceived the delay lock loop and the phase angle generator.

SUMMARY

It is therefore an object of the present invention to provide a DLL including a VCDL having relatively less delay cells and achieving the same delay functions.

It is therefore another object of the present invention to provide a phase angle generator generating an output signal in an arbitrary phase.

According to the first aspect of the present invention, the DLL delaying an input signal includes a quadrature generator receiving the input signal and generating a phase-changing signal, a delay line receiving the input signal and generating a delay signal and a voltage controller receiving the phase-changing signal and the delay signal and generating a control voltage, in which the delay line receives the control voltage and controls a delay time of the delay signal accordingly.

Preferably, the quadrature generator is a 25% duty cycle correction circuit.

Preferably, the delay line comprises a plurality of delay cells connected in series, and each of the plurality of the delay cells is a quadrature delay cell.

Preferably, the plurality of delay cells generate their respective delay signals, and each of which has a specific delay time.

Preferably, the specific delay times are different from one another.

Preferably, the voltage controller includes a phase detector detecting a phase error between the phase-changing signal and the delay signal, a charge pump generating a current according to the phase error and a loop filter generating the control voltage according to the current.

According to the second aspect of the present invention, the phase angle generator generating an output signal in an arbitrary phase includes a first quadrature generator receiving a first input signal and generating a first phase-changing signal, a plurality of delay cells receiving the first input signal and generating their respective delay signals, a voltage controller receiving the first phase-changing signal and the respective delay signals for generating a plurality of control voltages for the respective delay cells, in which the plurality of delay cells receive the respective control voltages and control a respective delay time of the respective delay signal accordingly, a first multiplexer receiving the plurality of delay signals and selecting one of the plurality of delay signals for generating a second input signal, a second quadrature generator receiving the second input signal and generating a plurality of second phase-changing signals and a second multiplexer receiving the plurality of second phase-changing signals and selecting one of the plurality of second phase-changing signals for generating the output signal.

Preferably, the voltage controller includes a phase detector detecting a phase error between the first phase-changing signal and each of the plurality of delay signals, a charge pump circuit generating a current according to the phase error and a loop filter generating the control voltage according to the current.

According to the third aspect of the present invention, the phase angle generator generating an output signal in an arbitrary phase includes a plurality of sub-phase angle generators, each of which includes a first quadrature generator receiving a first input signal and generating a first phase-changing signal, a plurality of delay cells receiving the first input signal and generating their respective delay signals, a voltage controller receiving the first phase-changing signal and the respective delay signals for generating a plurality of control voltages for the respective delay cells, in which the plurality of delay cells receive the respective control voltages and control a respective delay time of the respective delay signal accordingly, a first multiplexer receiving the plurality of delay signals and selecting one of the plurality of delay signals for generating a second input signal, a second quadrature generator receiving the second input signal and generating a plurality of second phase-changing signals and a second multiplexer receiving the plurality of second phase-changing signals and selecting one of the plurality of second phase-changing signals for generating the output signal, in which the output signal generated from a specific sub-phase angle generator is the first input signal of a subsequent sub-phase angle generator.

Preferably, the voltage controller includes a phase detector detecting a phase error between the first phase-changing signal and each of the plurality of delay signals, a charge pump circuit generating a current according to the phase error and a loop filter generating the control voltage according to the current.

The present invention may best be understood through the following descriptions with reference to the accompanying drawings, in which:

DETAILED DESCRIPTION OF THE PREFERRED EMBODIMENT

In a complex electrical system, the signals flowing through different circuit blocks are frequently not delivered according to the theoretical time points due to the parasite resistors, the parasite capacitors and the parasite inductors generated among the connection lines, the leads and the electronic elements due to the parasitic effects such that the operational times of the system are not accurate and the responses of the system are inaccurate also. To solve this problem, a circuit including a clock generator such as a DLL is employed, and the circuit system follows the clock signals generated by the clock generator to operate. In the case of the DLL, it offers a clock delay of a signal, just like a clock, such that the electrical system follows the exact clock time points to operate such that operations among different circuits of the electrical system are synchronized.

The main function of the DLL is to generate the detailed delay time points, and the value of a time step, σT, generated by the DLL is expressed in the following formula (1):

$$\sigma T = \frac{1}{f \times N} \quad (1)$$

In which, f is the operational frequency of the clock, and N is the total number of the time points.

For example, if the clock generator is a charge coupled device (CCD), usually the operational frequency of which is in the range of 10 MHz~40 MHz, and the total number of the time points for the clock partition, N, is 48 such that each time step required by the system, σT, is in the range of 2.08 ns~0.52 ns. If this clock generator is accomplished by an analog circuit, the VCDL would include 48 delay cells, however, relatively the VCDL block occupies a larger volume and consume a higher power.

Figure 1A:
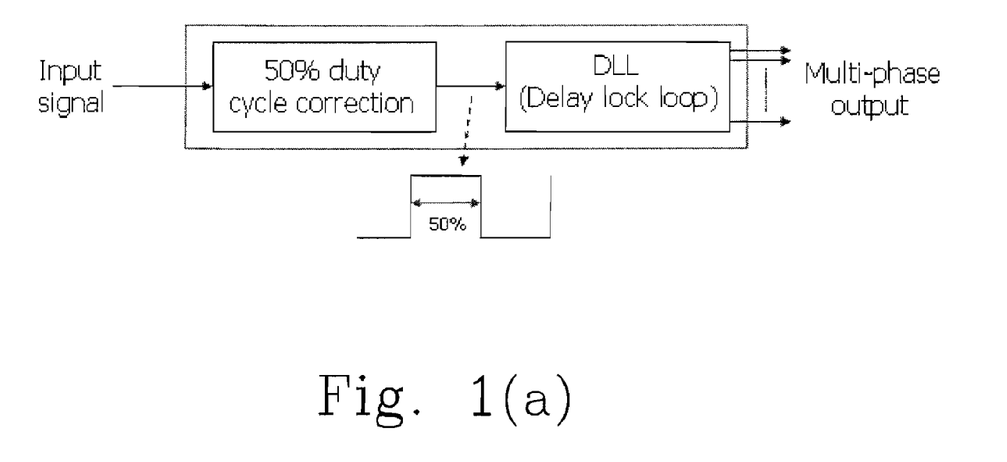
FIG. 1(a) is a block diagram of a DLL having a 50% duty cycle correction circuit according to the first preferred embodiment of the present invention.
Figure 1B:
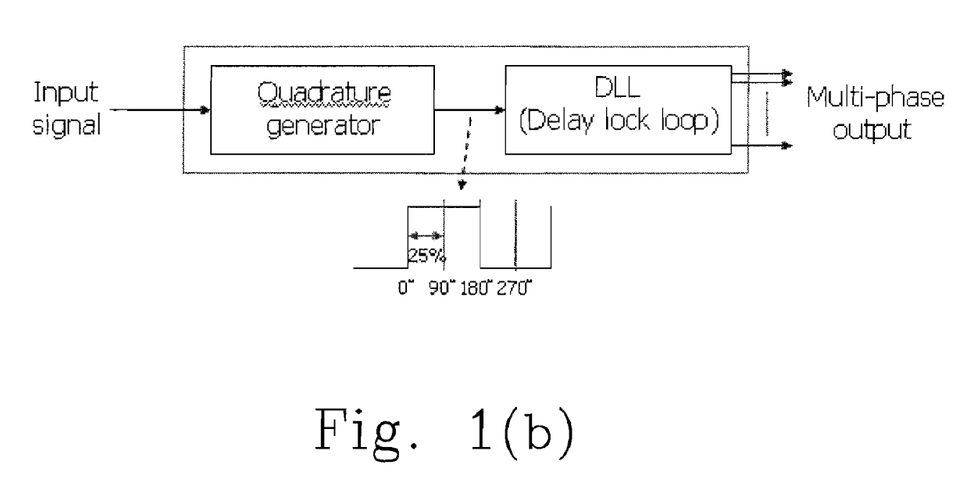
FIG. 1(b) is a block diagram of a DLL having a quadrature generator according to the second preferred embodiment of the present invention.

To solve the above-mentioned problem, one could deal with the lock modes of the DLL first. FIG. 1(a) is the block diagram of a DLL having a 50% duty cycle correction circuit according to the first preferred embodiment of the present invention, and FIG. 1(b) is the block diagram of a DLL having a quadrature generator according to the second preferred embodiment of the present invention. As shown in FIG. 1(a), a 50% duty cycle correction circuit is added between the input signal and the DLL to modify the input signal into a 50% clock periodic signal so as to generate a one-half period clock signal, the lock modes of the DLL operations are modified according to this clock such that the DLL would be locked for only one-half of a period, and the time step between two time points is expressed in the following formula (2):

$$\sigma T = \frac{1}{2 \times f \times N} \quad (2)$$

Using the operations of the CCD as an example again, the total number of the time points for the clock partition N is 24 while f=10 MHz~40 MHz, and σT is in the range of 2.08 ns~0.52 ns both as aforementioned. That is to say, the total number of the time points for the clock partition becomes one-half of the original N when the input signal becomes a clock signal including a period of one-half of the original period such that the total number of delay cells of the interior VCDL including by the DLL is decreased from 48 to 24.

Referring to FIG. 1(b), if a quadrature generator is added between the input signal and the DLL so as to turn the input signal into a phase-shifting signal having a 90° phase-shift such that a clock including a 25% clock periodic signal, i.e. a one-fourth period clock signal, is generated, the DLL changes the total number of time points for the clock partition according to this clock, and each of the time steps is expressed in the following formula (3):

$$\sigma T = \frac{1}{4 \times f \times N} \quad (3)$$

According to the same conditions of the CCD, the total number of time points, N, is only 12.

From the above-mentioned first and second preferred embodiments, the employments of the 50% duty cycle correction circuit and the quadrature generator effectively decrease the delay cells to one-half and one-fourth respectively, and the total circuit volumes and power consumptions of the delay cells of the VCDL block decrease to one-half and one-fourth respectively. Therefore, if the present invention is employed to a different system requiring an even more accurate and detailed time step for the clock partition, the effectiveness of the provided technology is even better.

Figure 2A:
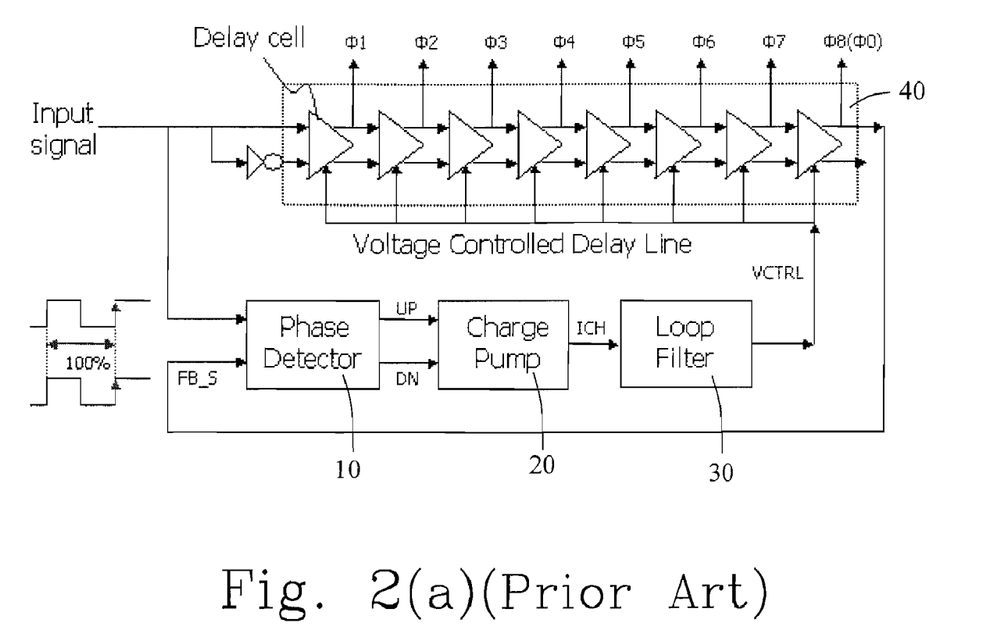
FIG. 2(a) shows a schematic circuit diagram of a conventional analog DLL having eight delay cells.
Figure 2B:
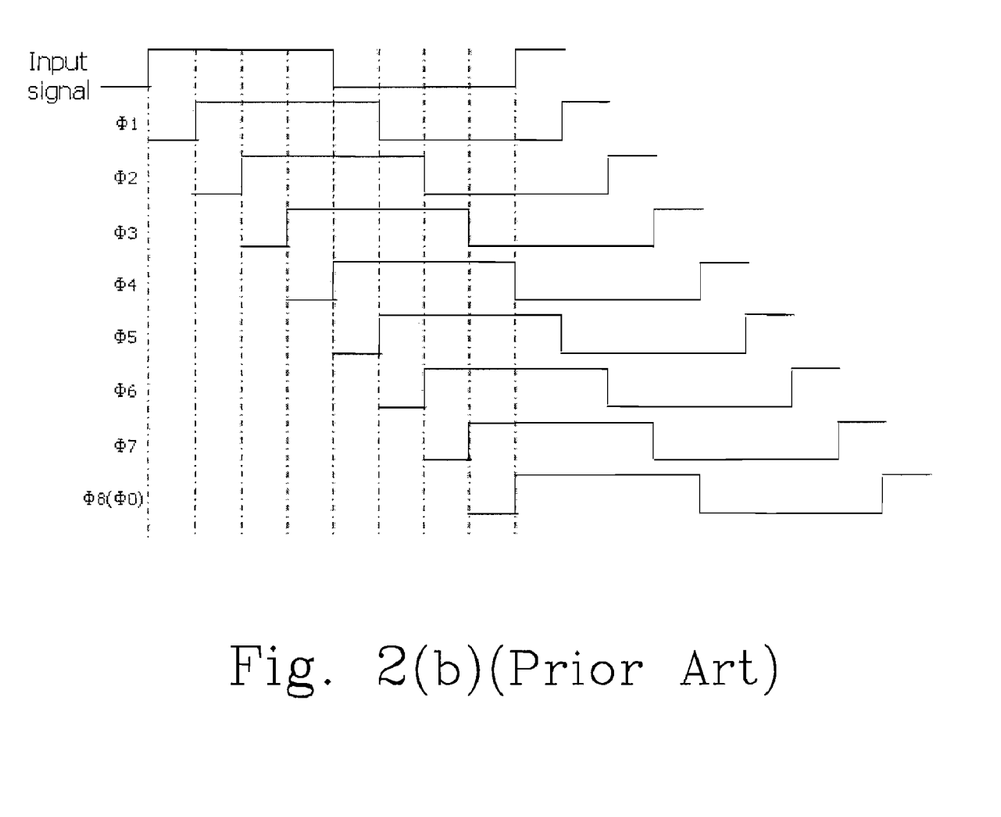
FIG. 2(b) shows waveform diagrams of eight delay signals having different time points, Φ1~Φ8, which are generated by a VCDL of the prior art.

The following is a conventional analog DLL circuit configuration employed to further describe the advantages of the present invention and as shown in FIG. 2(a). In FIG. 2(a), it shows a schematic circuit diagram of a conventional analog DLL having eight delay cells. Please refer to FIG. 2(a), an input signal is sent into a chain of eight stages of delay cells (all of the eight delay cells have the same specification), i.e. a VCDL, and $\phi_1$~$\phi_8$ as shown in FIG. 2(b), delay signals of eight different time points, are generated. Through feedback, the last delay signal $\phi_8$ is feedbacked to the phase detector 10, i.e. via comparing a clock error between the input signal and the FB_S signal to generate two error signals UP and DN, a current ICH is generated via a charge pump 20, the current ICH is transformed into a voltage controlled signal VCTRL via a loop filter 30, and the VCTRL is sent into each of the delay cells of the VCDL 40 to control and to adjust the value of the delay. Following such a feedback mode, the input signal is locked to a clock period finally, and each stage of delay cell is generating one of the exact delay value and the phase changing value in average ($\phi_1$~$\phi_8$). In the above-mentioned example, there are eight stages of delay steps. If a circuit requires forty eight stages of delay cells or even more, the increments of the total circuit volumes and the power consumptions are quite significantly since both of the most volume consuming part and the most power consuming part of the DLL circuit are the delay cells of the VCDL.

Figure 3:
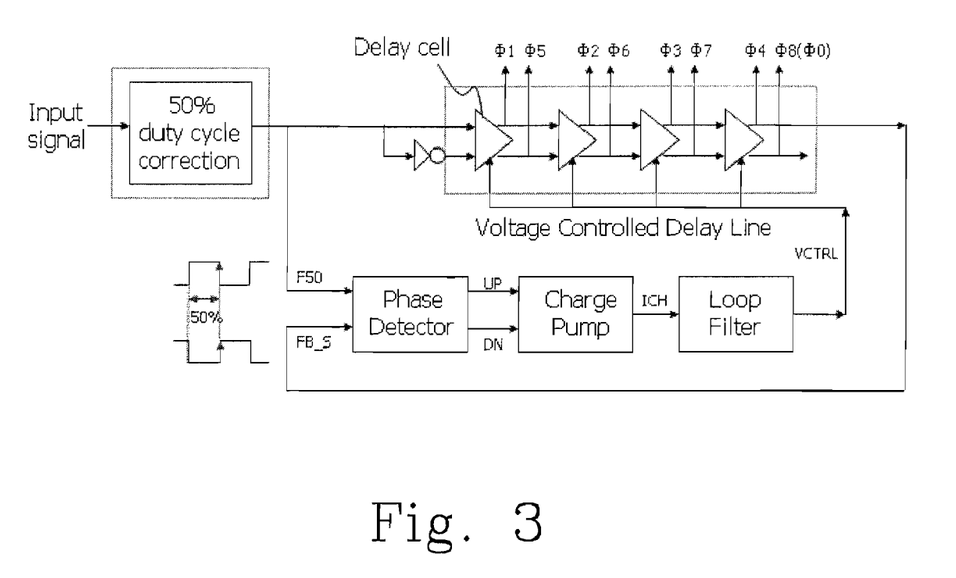
FIG. 3 shows a schematic circuit diagram of a DLL having a 50% duty cycle correction circuit according to the first preferred embodiment of the present invention.

In the present invention, the total number of the delay cells in the VCDL is decreased via changing the locking mode. FIG. 3 shows a schematic circuit diagram of a DLL having a 50% duty cycle correction circuit according to the first preferred embodiment of the present invention. For locking one-half of a period of the input signal by the DLL, the input signal is sent through the 50% duty cycle correction circuit of the first preferred embodiment of the present invention, and a phase-changing signal F50, which has a period that is one-half of the original period of the input signal for sure, is generated. Since the DLL locks only these parts of the time periods, only one-half of the original delay cells are required. Referring to FIG. 3, only four stages of delay cells in the VCDL are required to cope with the 50% duty cycle correction circuit. Through the same feedback mechanism, the delay signal of the last stage (the fourth stage) $\phi_4$ (FB_S) is sent back and is compared with the phase-changing signal F50 to determine the phase-shift between these two signals. Through this feedback mode, these two signals are locked, the DLL circuit gets the exact delay value, and the phase delays of $\phi_1$~$\phi_4$ are generated accordingly. As to another four delay signals $\phi_5$~$\phi_8$, which can be formed by a differential delay unit. Since the delays of $\phi_5$~$\phi_8$ are in opposite phases of those of $\phi_1$~$\phi_4$, the phase delays of $\phi_5$~$\phi_8$ are derived from the phase delays of $\phi_1$~$\phi_4$, which are generated by the DLL circuit.

Through the aforementioned method of the present invention, not only the eight stages delay signals are generated but also the total numbers of the delay cells in the DLL and the related power consumptions are decreased by one-half. If the duty cycle of an input signal of the DLL is known to be 50% of that of the original input signal desired to be processed, even the 50% duty cycle correction circuit of the provided DLL circuit of the present invention can be omitted.

If the present invention is applied to a system, which requires more stages of detailed time steps (such as a CCD), relatively the advantages of the present invention over those of the prior art are even more apparent. Comparing the present invention with the array arrangement method and the interpolator method mentioned in the prior art, relatively the present invention is more clear and direct, no extra and complex digital circuits are required as the auxiliaries, the phase error is decreased, the phase delay is more accurate, and the related costs are saved.

Figure 4:
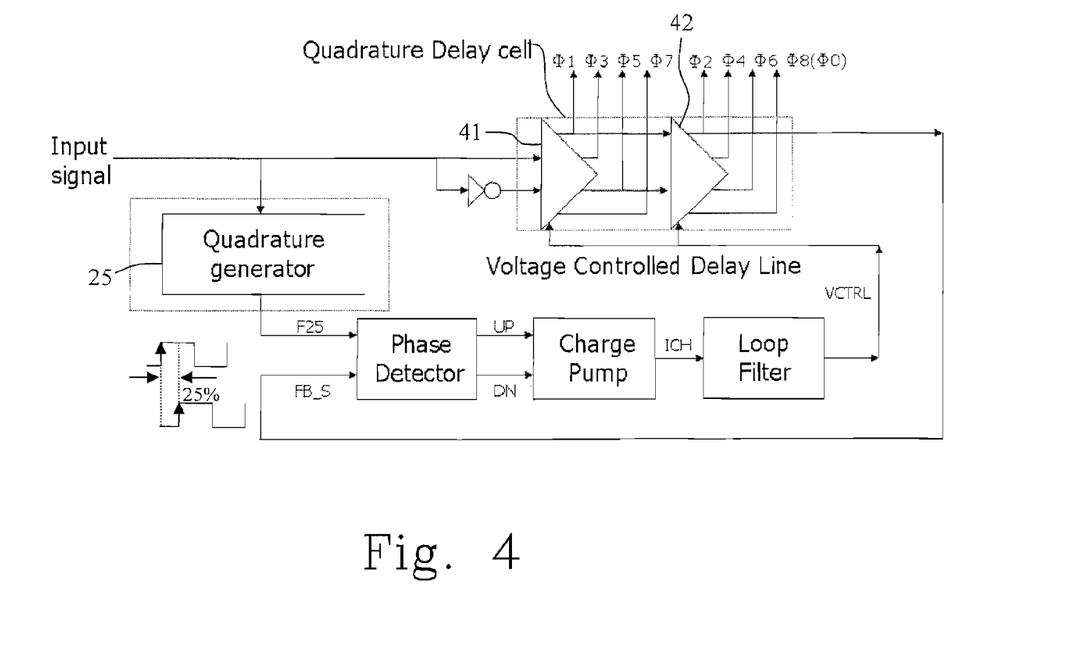
FIG. 4 shows a schematic circuit diagram of a DLL having a quadrature generator according to the second preferred embodiment of the present invention.

Similarly, if a phase-changing signal has a period including a duty cycle time that is one-fourth of that of the input signal, the delay cells required by the DLL are even less. FIG. 4 shows a schematic circuit diagram of a DLL having a quadrature generator according to the second preferred embodiment of the present invention. Please refer to FIG. 4, the quadrature generator 25 is one of a phase interpolator and a phase blender, which turns the input signal into four different phase-changing signals having four different phase angles of 0°, 90°, 180° and 270° respectively. In the second preferred embodiment of the present invention, the phase-changing signal having the phase angle of 90° is taken, i.e. the signal F25 including a period that is one-fourth of the period of the input signal is locked. As shown in the formula (3), the VCDL requires only two stages of delay cells. To cope with the quadrature generator 25, two quadrature delay cells (QDC) each generating four delay signals, 41 and 42, are employed for the two stage of delay cells. By the same token, the delay signal of the last stage $\phi_2$(FB_S) is feedbacked to the phase detector and is locked and compared with F25 to determine the phase-shift. After locked, the first stage of the QDCs 41 generates the delay signals of 45°($\phi_1$), 135°($\phi_3$), 225°($\phi_5$) and 315°($\phi_7$), and the second stage of the QDCs 42 generates another four delay signals of 90°($\phi_2$), 180°($\phi_4$), 270°($\phi_6$) and 360°($\phi_8$). According to the first and the second preferred embodiments of the present invention, the provided technology of the present invention could be employed to improve the DLL circuits of the prior art via changing the locking modes to overcome the aforementioned drawbacks of the prior art so as to generate the required accurate time delay, and the total circuit volumes and power consumptions of the VCDL are decreased such that the related costs are saved.

Due to the enormous advantages of employing the quadrature generator, a second aspect of the present invention is further explored. Since the outputted signals are expressed in different phase angles, these phase angles could be divided into even more detailed time steps by the DLL circuit. According to the second preferred embodiment of the present invention as shown in FIG. 4 and the formula (3), the locking mode of the provided DLL circuit is locking the delay signal having a period that is one-fourth of the period of the input signal, the total number of the delay cells is N/4 (N is the total number of the time points), i.e. dividing into N/4 time steps within ¼ period, and viewing from the phase angles, a resolution of each time step $\Delta\Phi$. is expressed in the following formula (4):

$$\Delta\phi = \frac{\pi/2}{N/4} \tag{4}$$

From the second preferred embodiment as shown in FIG. 4, each time step corresponds to 45° while a period of a clock corresponds to 360°, and the clock period is divided into eight time steps, and $\Delta\Phi=45°$ while N=8 is replaced into the formula (4). Thus, the DLL could be used to generate eight different phase angles of 45°, 90°, 135°, 180°, 225°, 270°, 315° and 360°.

Figure 5:
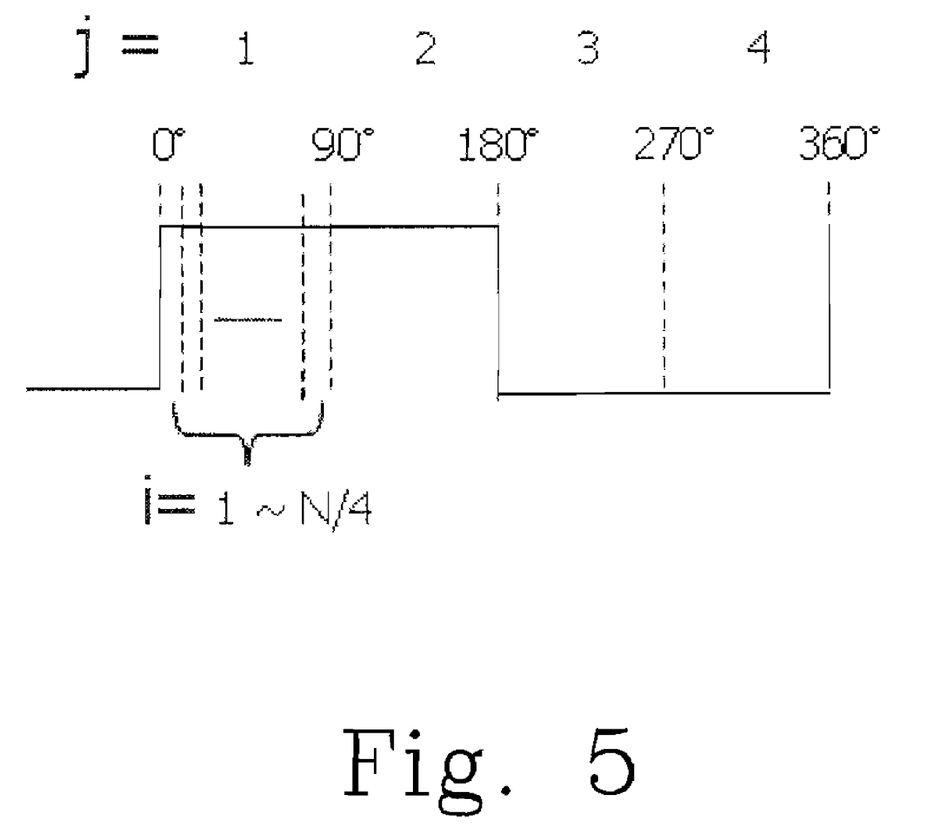
FIG. 5 shows a time period signal dividing into four quads, their respective angles and a plurality of time steps in the first quad according to the proposed dividing scheme of the present invention.

According to the above-mentioned method, a phase angle generator generating an output signal in an arbitrary phase could be formed. As shown in FIG. 5, it shows a time period signal dividing into four quads, their respective angles and a plurality of time steps in the first quad according to the proposed dividing scheme of the present invention. An input signal could be divided into four quads (j), each quad j will be further divided into i time steps, thus each of the input signal would have i*j time steps of different phase angle resolutions. Thus, an arbitrary phase angle $\phi_{ixj}$ can be expressed in the following formula (5):

$$\phi_{ixj} = \Delta\phi \times i + \frac{\pi}{2}(j-1) \tag{5}$$

Replace formula (4) into formula (5), and get:

$$\phi_{ixj} = \frac{\pi/2}{N/4} \times i + \frac{\pi}{2} \times (j-1) \tag{6}$$

In which, i=1~N/4, j=1~4.

If a matrix is used to indicate the location of each phase angle, the matrix is expressed in the following formula (7):

$$\phi_{ixj} = \begin{bmatrix} \phi_{11} & \phi_{12} & \cdots & \phi_{1j} \\ \phi_{21} & \phi_{22} & \cdots & \phi_{2j} \\ \vdots & \vdots & \ddots & \vdots \\ \phi_{i1} & \phi_{i2} & \cdots & \phi_{ij} \end{bmatrix}_{ixj} \tag{7}$$

Figure 6:
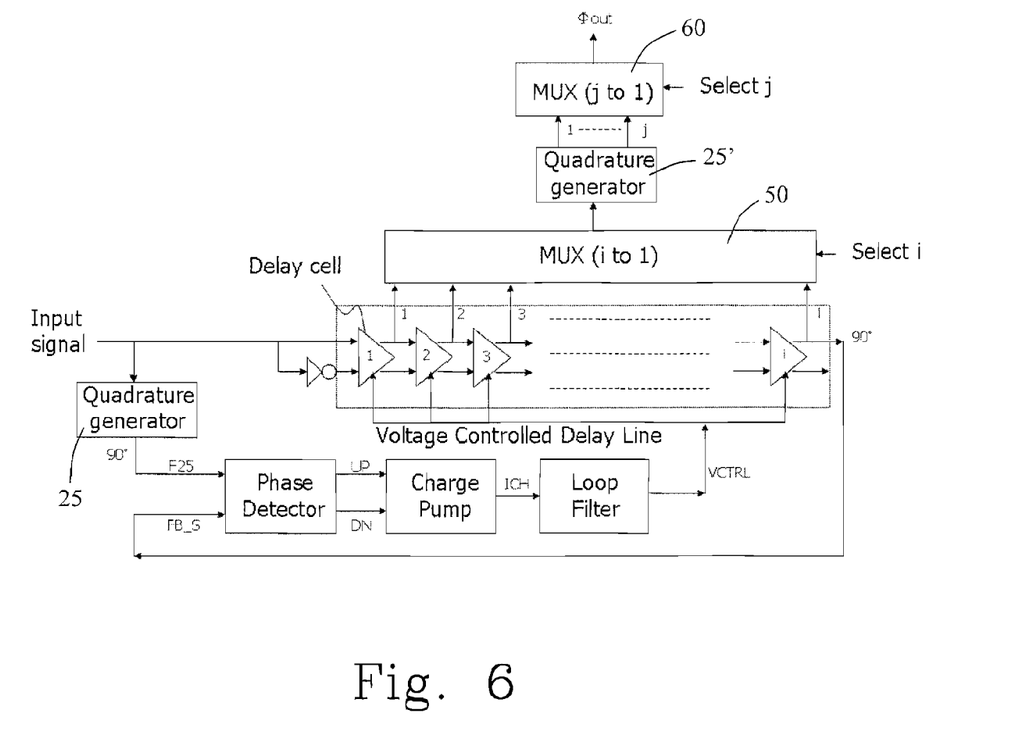
FIG. 6 shows a schematic circuit diagram of a phase angle generator generating an output signal in an arbitrary phase according to the third preferred embodiment of the present invention.

Please refer to FIG. 6, it shows a schematic circuit diagram of a phase angle generator generating an output signal in an arbitrary phase according to the third preferred embodiment of the present invention. In a range of a clock period of 360°, it is divided into N=i*j=40 phase angles. From the above-mentioned locking mechanism, DLL locks at the phase angle of 90° first, there are i phase angles in this one-fourth range, the resolution of each of the time step is expressed as in formula (4), i time steps of angles would be generated stably after the DLL locks, and the ith angle in a certain quad is selected by an i to 1 multiplexer 50 (MUX (i to 1)), a quadrature generator 25' is used to generate the four quads, and a j to 1 multiplexer 60 (MUX (j) to 1)) is used to select the located quad. Thus, the selected i and j values could be replaced into the formula (6) and the formula (7) to get an output value of an arbitrary phase angle of $\phi_{out}$.

Figure 7:
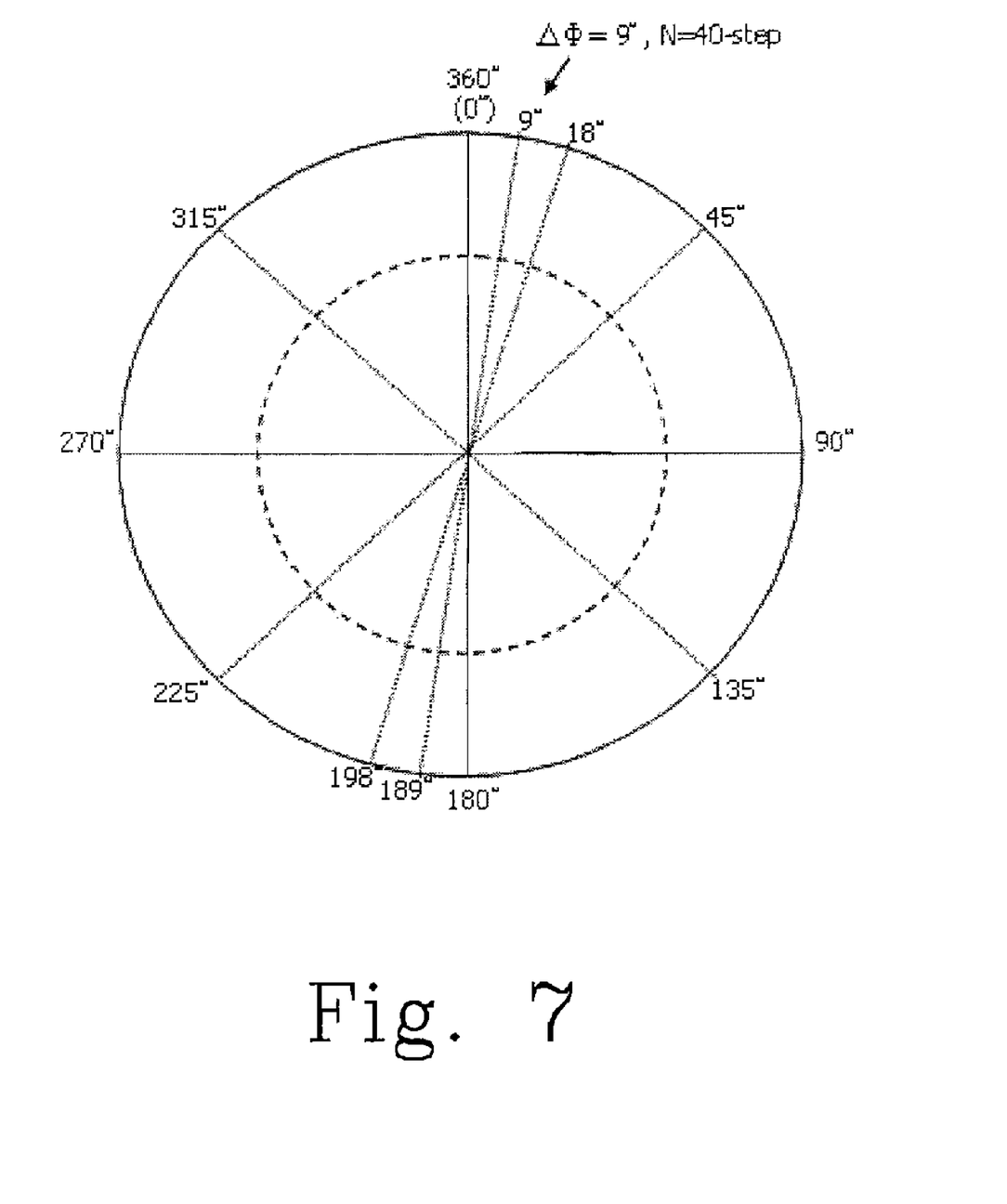
FIG. 7 shows outputted phase angles of a phase angle generator generating phase angles of multiples of nine degrees according to the fourth preferred embodiment of the present invention.
Figure 8:
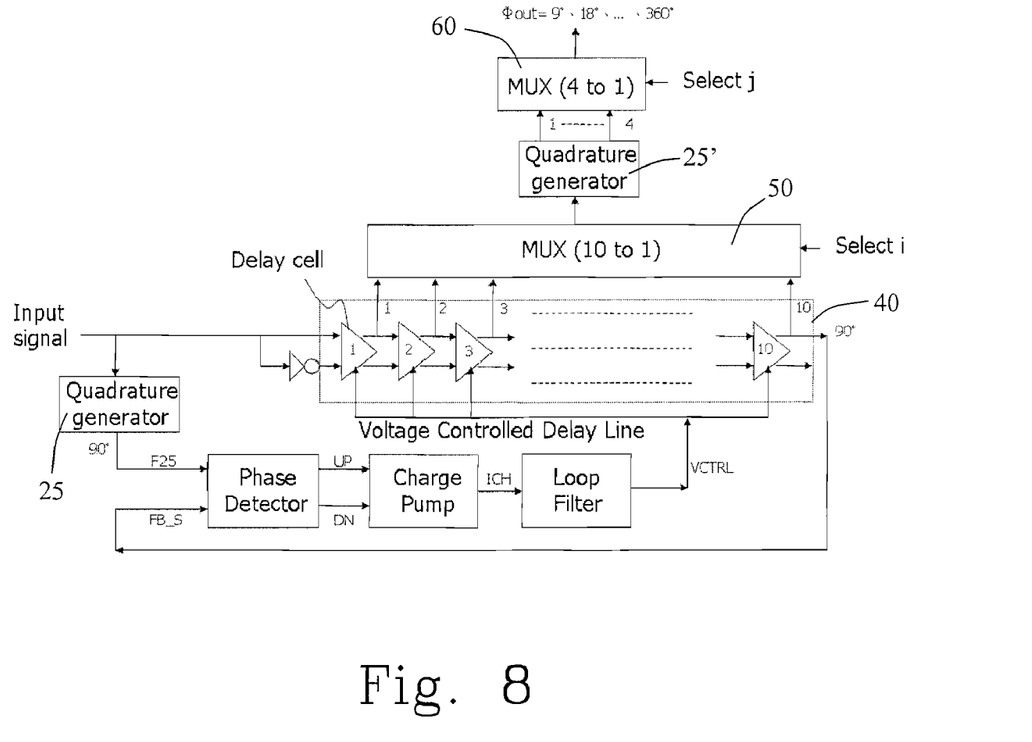
FIG. 8 shows a schematic circuit diagram of the phase angle generator generating phase angles of multiples of nine degrees according to the fourth preferred embodiment of the present invention.

Again, another preferred embodiment of the present invention is employed to describe the features and advantages of the present invention. In FIG. 7, it shows outputted phase angles of a phase angle generator generating phase angles of multiples of nine degrees according to the fourth preferred embodiment of the present invention. If a system outputs phase angles of multiples of nine degrees as shown in FIG. 7, there are in total N=i*j=40 time steps generated in a clock period of 360°. According to formula (4), the input signal could be divided into four quads, i.e. j=4, and each of the four quads has ten time steps, i.e. i=10. Please refer to FIG. 8, it shows a schematic circuit diagram of the phase angle generator generating phase angles of multiples of nine degrees according to the fourth preferred embodiment of the present invention. In which, the VCDL requires only ten delay cells, a 10 to 1 multiplexer 50 selecting i and a 4 to 1 multiplexer 60 selecting j. An arbitrary phase angle could be generated via a computation according to formula (5), i.e.

$$\phi_{ixj} = \Delta\phi \times i + \frac{\pi}{2} \times (j-1) = 9° \times \frac{\pi}{2} \times (j-1).$$

For example, if i=5 and j=2, $\Phi_{5\times2}=9°\times5+(\pi/2)\times(2-1)=135°$. And, if i=8 and j=4, $\Phi_{8\times4}=9°\times8+(\pi/2)\times(4-1)=342°$. According to the matrix of formula (7), each of the phase angles $\Phi_{10\times4}$ could be expressed as follows:

$$\phi_{10\times4} = \begin{bmatrix} \phi_{11} & \phi_{12} & \phi_{13} & \phi_{14} \\ \phi_{21} & \phi_{22} & \phi_{23} & \phi_{24} \\ \vdots & \vdots & \vdots & \vdots \\ \phi_{101} & \phi_{102} & \phi_{103} & \phi_{104} \end{bmatrix}_{10\times4} = \begin{bmatrix} 9° & 99° & 189° & 279° \\ 18° & 108° & 198° & 288° \\ \vdots & \vdots & \vdots & \vdots \\ 90° & 180° & 270° & 360° \end{bmatrix}_{10\times4}$$

Therefore, through the provided circuit according to the fourth preferred embodiment of the present invention as shown in FIG. 8, the desired phase angles of multiples of nine degrees are generated.

Figure 9:
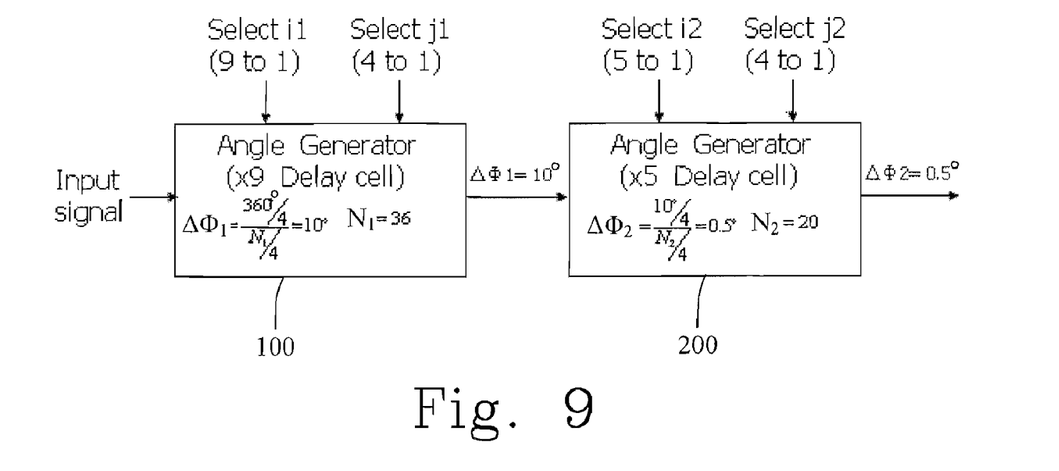
FIG. 9 shows a schematic circuit diagram of a phase angle generator having two cascaded sub-phase angle generators and generating an output signal in an arbitrary phase according to the fifth preferred embodiment of the present invention.

According to the third aspect of the present invention, a circuit system generating even more detailed phase angles and requiring relatively even less delay cells is provided. For example, if a more detailed phase angle resolution of $\Delta\phi=0.5°$ is desired, there are in total $N=i*j=720$ time steps in a clock period of 360°. If according to the second aspect of the present invention, the required delay cells of the circuit system decreases to one-fourth of 720, but 180 delay cells are still required. However, the 180 delay cells could be further decreased via the third aspect of the present invention as shown in FIG. 9. Please refer to FIG. 9, it shows a schematic circuit diagram of a phase angle generator having two cascaded sub-phase angle generators and generating an output signal in an arbitrary phase according to the fifth preferred embodiment of the present invention. In the first sub-phase angle generator, the angle generator 100, the clock period of 360° is divided by an angle resolution of $\Delta\phi_1=10°$, and there are $N_1=i_1*j_1=36$ time steps. That is to say, $i_1=9$, and nine delay cells are required in the angle generator 100. Given $\Delta\phi=10°$ as the input signal of the second sub-phase angle generator, the angle generator 200, the clock period of 10° is divided by an angle resolution of $\Delta\phi_2=0.5°$, and there are $N_2=i_2*j_2=20$ time steps. That is to say, $i_2=5$, and five delay cells are required in the angle generator 200. Thus, not only the more detailed phase angle resolution of $\Delta\phi=0.5$ is gotten, but also the total number of delay cells required in the first and the second sub-phase angle generator is decreased to only 14, which dramatically decreases the number of electronic elements in the circuit system while comparing with the original design, which requires 180 delay cells. Although two cascaded sub-phase angle generators are required, the total circuit volumes and the power consumptions are much less than the original design. Besides, the noises and parasitic effects generated by the electronic elements are relatively smaller and the more detailed phase angles generating by the provided phase angle generator are more accurate due to the dramatically decreased total number of electronic elements. Thus, the provided phase angle generator can be apply to various consumer electronics, such as the communication systems, the digital signal processing systems (DSP), the motor control systems and many other mechanical systems, to achieve the required functions of these systems.

In conclusion, the provided DLL has the advantages that it includes a VCDL having relatively less delay cells but still achieves the same delay functions. And also, the provided phase angle generator generates an output signal in an arbitrary phase and includes relatively less delay cells.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A delay lock loop (DLL) delaying an input signal, comprising:
    a 25% duty cycle correction circuit receiving the input signal and generating a phase-changing signal;
    a delay line receiving the input signal and generating a delay signal; and
    a voltage controller receiving the phase-changing signal and the delay signal and generating a control voltage,
    wherein the delay line receives the control voltage and controls a delay time of the delay signal accordingly.

2. A delay lock loop according to claim 1, wherein the delay line comprises a plurality of delay cells connected in series, and each of the plurality of delay cells is a quadrature delay cell.

3. A delay lock loop according to claim 2, wherein the plurality of delay cells generates their respective delay signals, and each of which has a specific delay time.

4. A delay lock loop according to claim 3, wherein the specific delay times are different from one another.

5. A delay lock loop according to claim 1, wherein the voltage controller comprises a phase detector detecting a phase error between the phase-changing signal and the delay signal, a charge pump generating a current according to the phase error and a loop filter generating the control voltage according to the current.

* * * * *